(12) United States Patent
Dupart et al.

(10) Patent No.: US 10,008,059 B2
(45) Date of Patent: Jun. 26, 2018

(54) ACCESS CONTROL READER AND COMPLEMENTARY CONTROL MODULE

(71) Applicant: SYSTEMES ET TECHNOLOGIES IDENTIFICATION (STID), Greasque (FR)

(72) Inventors: Vincent Dupart, Saint-Maximin-la-Sainte-Beaume (FR); Jérôme Silve, Rousset (FR); Sylvain Poitrat, Greasque (FR)

(73) Assignee: SYSTEMES ET TECHNOLOGIES IDENTIFICATION (STID), Greasque (FR)

( * ) Notice: Subject to any disclaimer, the term of this patent is extended or adjusted under 35 U.S.C. 154(b) by 29 days.

(21) Appl. No.: 15/109,434

(22) PCT Filed: Jan. 5, 2015

(86) PCT No.: PCT/FR2015/050005
§ 371 (c)(1),
(2) Date: Jun. 30, 2016

(87) PCT Pub. No.: WO2015/104486
PCT Pub. Date: Jul. 16, 2015

(65) Prior Publication Data
US 2016/0328897 A1 Nov. 10, 2016

(30) Foreign Application Priority Data

Jan. 7, 2014 (FR) .................... 14 50088

(51) Int. Cl.
*G06K 7/00* (2006.01)
*G07C 9/00* (2006.01)
(Continued)

(52) U.S. Cl.
CPC .......... *G07C 9/00158* (2013.01); *G06K 7/00* (2013.01); *G06K 7/10415* (2013.01);
(Continued)

(58) Field of Classification Search
CPC ............ G07C 9/00007; G07C 9/00023; G07C 9/00031; G07C 9/00087; G07C 9/00158;
(Continued)

(56) References Cited

U.S. PATENT DOCUMENTS 4,595,115 A 6/1986 Huynh
4,791,244 A 12/1988 Taybl
(Continued)

FOREIGN PATENT DOCUMENTS

CH 495684 A 8/1970
DE 1616794 B1 9/1970
(Continued)

OTHER PUBLICATIONS

International Search Report dated Mar. 9, 2015 re: Application No. PCT/FR2015/050004, pp. 1-3, citing: EP 0 253 756 A2, US 2011/054830 A1, DE 197 46 118 A1, CH 495 684 A, DE 16 16 794 B1.
(Continued)

*Primary Examiner* — Laura Gudorf
(74) *Attorney, Agent, or Firm* — Cantor Colburn LLP

(57) ABSTRACT

An access control reader includes a housing with a base having a main wall for securing to a support and at least one front part mounted on the base. Each front part includes a front wall opposite the main wall of the base in a closed configuration of the housing. The access control reader further includes an electronic board incorporating at least one controller, a memory and a main access-control device, the controller driving the main access-control device by implementing a first drive algorithm loaded in the memory. The housing includes a component for securing a complementary access-control module and component for passing a connection cable between the module and a connector mounted on the electronic board. The electronic board memory is loaded with a second drive algorithm for driving
(Continued)

the module such that the controller drives the module once the connection cable has been connected to the connector.

13 Claims, 6 Drawing Sheets

(51) Int. Cl.
    *G07F 7/08*     (2006.01)
    *G06K 7/10*     (2006.01)
    *H05K 5/00*     (2006.01)
    *H05K 5/02*     (2006.01)
    *H05K 7/14*     (2006.01)

(52) U.S. Cl.
    CPC ..... *G07C 9/00031* (2013.01); *G07C 9/00087* (2013.01); *G07F 7/0873* (2013.01); *H05K 5/0047* (2013.01); *H05K 5/0234* (2013.01); *H05K 5/0247* (2013.01); *H05K 7/1417* (2013.01); *G07C 2009/00095* (2013.01)

(58) Field of Classification Search
    CPC ... H05K 5/0047; H05K 5/0234; H05K 5/0247
    USPC ........................................................ 235/486
    See application file for complete search history.

(56) References Cited

U.S. PATENT DOCUMENTS

| | | |
|---|---|---|
| 5,397,886 A | 3/1995 | Mos et al. |
| 5,711,587 A | 1/1998 | Takahashi et al. |
| 6,123,401 A | 9/2000 | Chiba et al. |
| 2002/0121132 A1 | 9/2002 | Breed et al. |
| 2004/0042192 A1* | 3/2004 | Davidson ............... G06F 1/181 361/796 |
| 2005/0204167 A1 | 9/2005 | Conlin et al. |
| 2005/0207087 A1 | 9/2005 | Fisher et al. |
| 2011/0054830 A1 | 3/2011 | Logan |
| 2011/0202170 A1 | 8/2011 | Dawes et al. |
| 2013/0346168 A1 | 12/2013 | Zhou et al. |
| 2014/0090951 A1* | 4/2014 | Johnson ............. G07D 11/0051 194/344 |
| 2015/0145644 A1 | 5/2015 | Jalbert et al. |
| 2015/0325940 A1 | 11/2015 | Foseide |
| 2015/0330140 A1 | 11/2015 | Kincaid et al. |

FOREIGN PATENT DOCUMENTS

| | | |
|---|---|---|
| DE | 19746118 A1 | 5/1999 |
| EP | 0253756 A2 | 1/1988 |
| EP | 0353443 A2 | 2/1990 |
| EP | 2487351 A1 | 8/2012 |
| FR | 2988871 A1 | 10/2013 |
| WO | 9627858 A1 | 9/1996 |
| WO | 9850876 A1 | 11/1998 |

OTHER PUBLICATIONS

International Search Report dated Mar. 9, 2015 re: Application No. PCT/FR2015/050005, pp. 1-3, citing: WO 96/27858 A1 and WO 98/50876 A1.

* cited by examiner

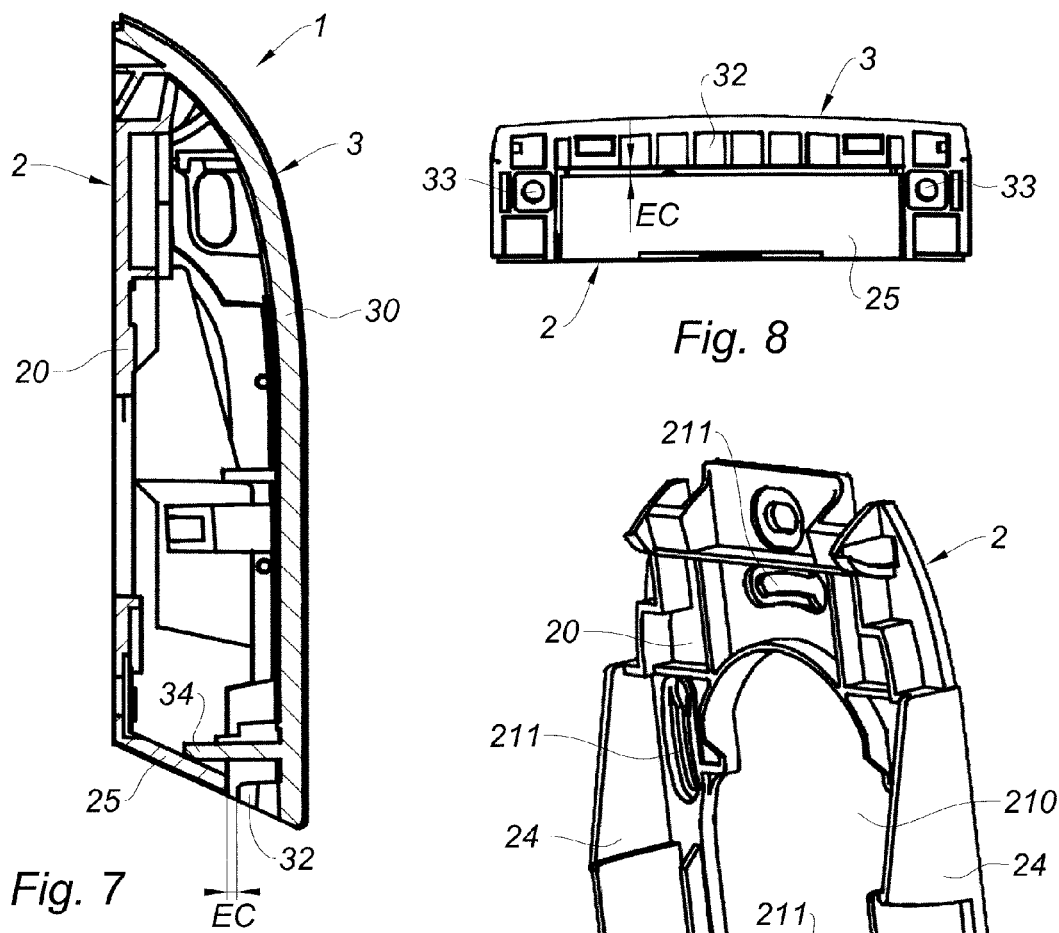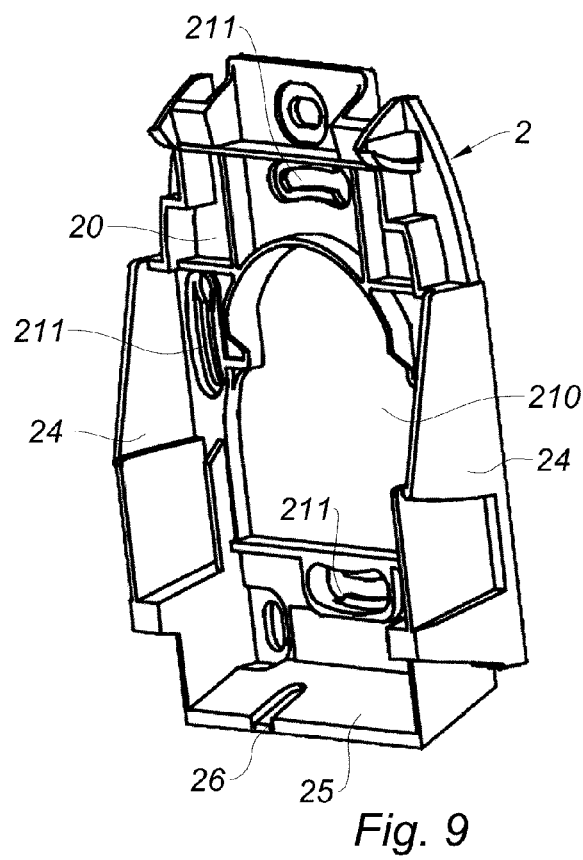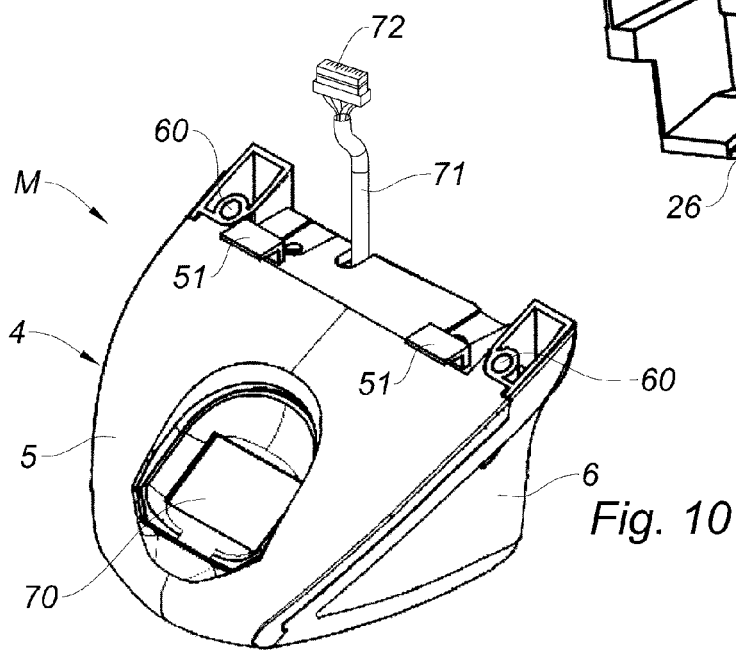

US 10,008,059 B2

ACCESS CONTROL READER AND COMPLEMENTARY CONTROL MODULE

TECHNICAL FIELD

The present disclosure relates to an access control reader, in particular of radio frequency identification (RFID) control, keyboard control or screen control. The disclosure further relates to a complementary control module, in particular of the biometric control, keyboard control or screen control type, adapted to be connected and fastened on such an access control reader. It also relates to an access control system integrating an access control reader and a complementary control module.

BACKGROUND

The access control readers, or secure identification readers, are generally equipped with one or more control feature(s) pre-integrated in a casing, as known in particular from the patent application FR 2 988 871.

From a standard reader, adding a new feature, such as a biometric control function, is not possible. It is required to uninstall the standard reader in order to install a new reader which integrates the desired new feature. In other words, the addition of a new feature is complex and expensive because it requires a complete uninstallation of the old reader and a complete reinstallation of the new reader.

It is also known, from the document WO 96/27858, to use an access control reader comprising a casing provided with a pedestal closed by a facing, where the facing is provided with an upper opening for receiving a keyboard or a screen which is connected to an electronic board. The facing is also provided with a central opening through which a board reading unit may be plugged into the casing. Once inserted, this board reading unit is joined to the electronic board by means of a connector which plugs into a complementary connector. Thus, the board reading unit is placed inside the casing of the reader, which has drawbacks because the casing of the reader must be large enough to receive the board reading unit, even if this board reading unit is not present. Furthermore, in the absence of this board reading unit, the casing of the reader carries risks of intrusion at the central opening of its facing.

The present disclosure aims to solve these drawbacks by providing an access control reader which allows adding a new feature to a reader, without having to replace it with another reader.

SUMMARY

To this end, the disclosure provides an access control reader, of the type comprising:
- a casing provided with a pedestal having a main wall provided for a fastening on a support and at least one facing mounted on said pedestal, the or each facing comprising a front wall which faces the main wall of the pedestal in a closed configuration of the casing; and
- an electronic board integrating at least one controller, a memory and a main access control device, this controller driving this main access control device through the implementation of a main driving algorithm loaded into the memory;

this reader being remarkable in that the casing includes fastening means of a complementary access control module and passage means of a connection cable between the module and a connector mounted on said electronic board, and in that the memory of the electronic board is loaded with a second driving algorithm for driving the module so that the controller drives this module once the connection cable is plugged into the connector.

Thus, this reader allows receiving a new feature present on a complementary module, by being shaped to allow the fastening of the module on the reader and the connection of the module to the electronic board, said electronic board being adapted for a direct integration of the module. Indeed, the electronic board is pre-set to accommodate and drive a complementary module, and thus, it is no longer required to put a reader already in place or to modify the existing installation (cabling, fastening holes, etc.). Thanks to the disclosure, all we have to do is to connect the complementary module to the electronic board, which will recognize and automatically manage this module, and to fasten the module on the casing of the reader.

Moreover, the complementary module, being fastened on the outside of the casing of the reader, the reader is sized to be usable alone, and no oversizing of the casing of the reader is required to accommodate the complementary module. In other words, the casing of the reader includes, more specifically, fastening means of the complementary access control module on the outside of the casing of the reader, and in particular on the underside of the casing of the reader.

According to one characteristic, the fastening means include:
- fastening holes provided on the pedestal and on the or each facing for the passage of the fastening screws; and
- temporary holding and indexing means of the module on the casing.

Thus, the fastening holes which serve for fastening the facing on the pedestal, will also serve for fastening the module on the casing. The temporary holding and indexing means will serve, for their part, for indexing in position the module on the reader (to properly center the module vis-à-vis the fastening holes and the passage means of the connection cable) and to temporarily hold the module in place, while screwing the screws, preferably of the tamperproof screw type.

According to another characteristic, the temporary holding and indexing means comprise:
- a lower edge of the pedestal protruding from the main wall and
- a lower edge of the or each facing protruding from the front wall, where, in the closed configuration of the casing, the lower edge of the facing is in alignment with the lower edge of the pedestal with a given spacing between the two lower edges to form a lower slot under the casing, in order to allow the passage and the indexing of the holding legs of the module.

Thus, in the absence of module, the casing has a single lower slot which, if required, will allow receiving the holding legs for the indexing and the temporary holding of the module on the casing.

Advantageously, the passage means comprise a line of weakness arranged on the lower edge of the pedestal to form an incipient crack of a fuse notch.

Such a fuse notch allows guaranteeing the tightness of the casing in the absence of a module, while allowing the formation of a passage for the connection cable after breaking the lower edge along the line of weakness.

In a particular embodiment, the or each facing further includes a lower plate protruding from the front wall and disposed above the lower edge where, in the closed configuration of the casing, said plate bears against the lower edge of the pedestal, and the passage means also comprise a notch arranged in said plate and which is, in the closed configuration of the casing, positioned opposite to the fuse notch provided on the lower edge of the pedestal.

This lower plate reinforces the tightness of the casing in the absence of the module, while allowing the passage for the connection cable due to its notch placed opposite to the fuse notch.

In a particular embodiment, the lower edge of the pedestal is tilted downward relative to the main wall by a non-right angle and, in the closed configuration of the casing, the plate of the facing is orthogonal to the main wall of the pedestal.

According to one possibility of the disclosure, the casing of the reader comprises at least another interchangeable facing with the facing of the casing, said other facing is equipped with a secondary access control device, in particular of the keyboard control or screen control type, and where the memory of the electronic board is loaded with a third driving algorithm for driving said secondary access control device so that the controller drives said secondary access control device once the other facing has replaced the facing on the casing and that the secondary access control device is connected to the electronic board.

Thus, the reader provides an advantageous modularity because it allows obtaining a new access control feature (for example by keyboard or camera), simply by replacing the facing by another facing and changing the cabling, without intervening on the electronic board. Indeed, the electronic board is already configured to allow driving this new feature (in this case the driving of the secondary access control device integrated to the other facing). Thus, the modularity of the reader results in the possibility of adding a complementary module and in the possibility of replacing a facing by another.

Advantageously, the or each facing includes snap-fit means adapted for a snap-fit fastening of the electronic board.

Such snap-fit means allow easy removal of the electronic board, in particular in case of a facing change as described hereinabove. Thus, if a facing is replaced (for example an entirely solid facing adapted to form a reading surface of a RFID badge) by another facing integrating a secondary access control device (for example a keyboard or a screen), it is sufficient to unclip the electronic board from the facing to reclipse it on another facing; the electronic board integrating as already explained in memory all the driving algorithms allowing managing all the desired features.

These snap-fit means then allow an easy insertion of the electronic board, a force mechanical holding, required for the robustness of the reader, and an easy extraction of the electronic board in order to change the facing for changing the reader towards new features (for example keyboard, screen, camera, . . . ), all without ancillary tool.

According to another possibility of the disclosure, the snap-fit means comprise bearing stops for the electronic board and the elastically deformable legs equipped respectively with snap-fit teeth, possibly with fixed retaining hooks, and for example all protruding from the front wall of the or each facing.

The disclosure also relates to a complementary control module, in particular of biometric control or keyboard control, adapted to be fastened and connected to a reader, said module comprising:

a casing equipped with complementary fastening means shaped to cooperate with the fastening means of the casing of the reader; and a complementary access control device, in particular of the biometric control or keyboard control type, disposed in said casing and joined to an outgoing connection cable of the casing of the module and shaped to pass through the passage means provided on the casing of the reader, said connection cable having a free end provided with a complementary connector shaped to be plugged onto the connector of the electronic board of the reader.

Thus, this complementary module allows bringing a new feature to a reader already in place, as explained hereinabove, by joining the connection cable to the electronic board and by fastening the casing of the module on the casing of the reader, and more specifically outside the casing of the reader; without having to reconfigure the controller of the reader.

According to an advantageous characteristic, the complementary fastening means comprise:

holes arranged on the module and adapted to match with the fastening holes of the reader, in order to allow the mating fastening of the module on the casing and of the facing on the pedestal with the same fastening screws; and complementary temporary holding and indexing means shaped to cooperate with the temporary holding and indexing means of the reader.

According to another characteristic, the complementary temporary holding and indexing means include temporary holding legs adapted to engage through the lower slot provided under the casing of the reader and to bear against the lower edge of the facing.

The present disclosure also concerns an access control system comprising a reader according to the disclosure and a complementary control module according to the disclosure, the casing of the module being fastened on the casing of the reader and the complementary access control device being connected to the electronic board of the reader by means of the connection cable passing through the passage means provided on the casing of the reader.

BRIEF DESCRIPTION OF THE DRAWINGS

Other characteristics and advantages of the present disclosure will appear upon reading the detailed description hereinafter, of a non-limiting example of implementation, with reference to the appended figures in which:

FIG. 7 is a cross-sectional view of the casing of the reader of FIG. 1;

FIG. 8 is a bottom view of the casing of the reader of FIG. 1;

FIG. 9 is a front perspective view of a pedestal of the casing of the reader of FIG. 1;

FIGS. 10 to 11 are front (FIG. 10) and back (FIG. 11) perspective views of the casing of an example of complementary biometric control module according to the disclosure;

DETAILED DESCRIPTION OF THE DRAWINGS

Figure 1:
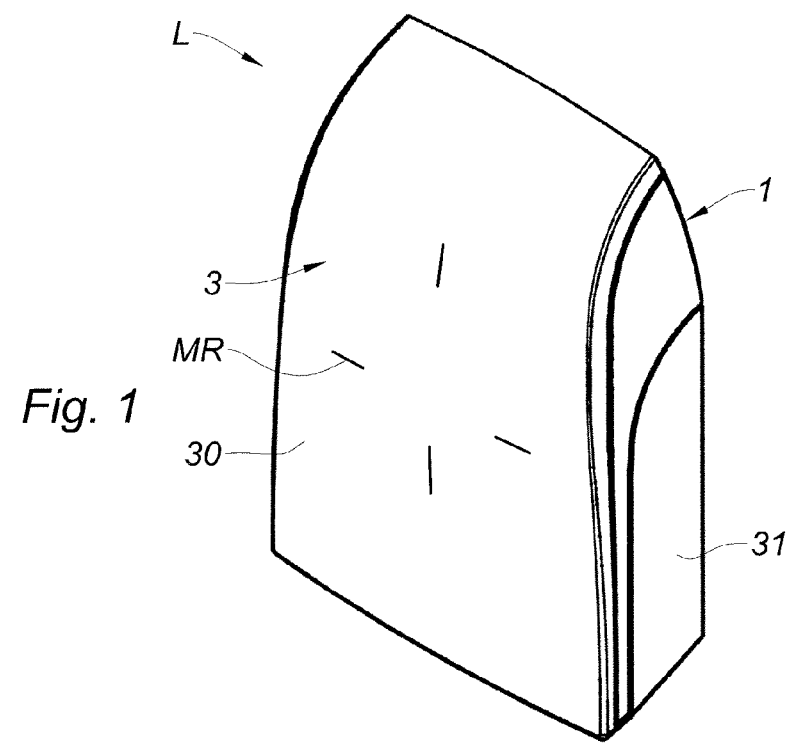
FIG. 1 is a front perspective view of a first example of reader according to the disclosure which includes a casing provided with a full front facing only for a radio identification reading.
Figure 3:
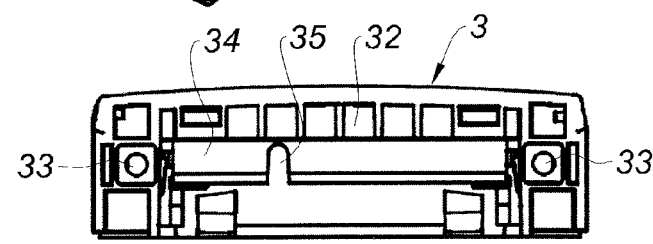
FIG. 3 is a bottom view of the facing of FIG. 2.
Figure 2:
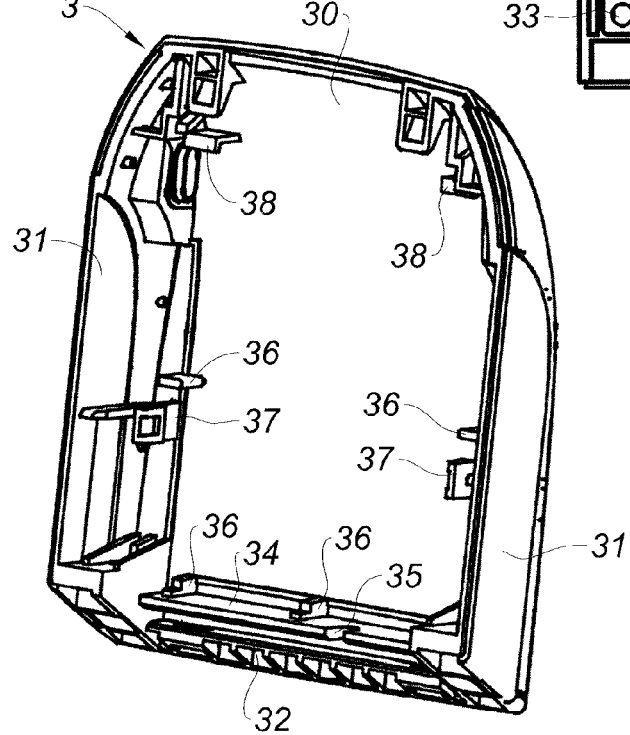
FIG. 2 is a perspective view of the back of a facing of the reader casing of FIG. 1.

Referring to the figures, a reader L according to the disclosure includes a casing 1 composed of two portions: a pedestal 2 provided for fastening on a vertical support (not illustrated), generally a wall or a partition, and a facing 3 mounted on the pedestal 2. Once the facing 3 mounted on the pedestal 2, the casing 1 internally delimits a closed space within which an electronic board 9 is disposed integrating at least a controller (in particular of the microprocessor type), a memory and a main access control device (not illustrated).

The main access control device, integrated to the electronic board 9, is composed of a radio-identification (RFID) reader for reading badges provided with RFID chips. The controller drives this main radio-identification access control device by implementing a first driving algorithm loaded in the memory of the electronic board 9.

The pedestal 2 includes a wall called planar main wall 20 which abuts against the support in order to be fastened thereto. This planar wall 20 has a central opening 210 for the passage of cables (not illustrated) and preferably oblong holes 211 for the passage of fastening screw (not illustrated) of the pedestal 2 on the support. The main wall 20 has an inner face opposite the facing 3 once the casing 1 is mounted, and an outer face opposite to the inner face, where said outer face abuts against the support once the pedestal 2 is fastened on the support.

The pedestal 2 also includes two opposite lateral edges 24, which protrude from the inner face of the main wall 20 and which are perpendicular to the main wall 20. The pedestal 2 also includes a lower edge 25 also protruding from the inner face of the main wall 20 and which is provided on a lower portion of the pedestal 2, which will be located at the bottom once the casing 1 is in situation, this lower edge 25 linking the two lateral edges 24.

A line of weakness is arranged on the lower edge 25 of the pedestal 2 to form an incipient crack of a fuse notch 26. This line of weakness is carried out in the shape of a reduction of the thickness of the lower edge 25, on the periphery of the fuse notch 26.

The pedestal 2 also has two holes (not visible) arranged in lower portion of the pedestal 2, for the passage of fastening screws through the facing 3 on the pedestal 2. For more details regarding the fastening of the facing 3 on the pedestal 2, we will refer usefully to the patent application filed by the Applicant on the same day as the present application, and we incorporate, in reference, all her teachings in the present patent application.

Three examples of reader L are described hereinafter, specifying that only the facing 3 changes between the different readers L, the pedestal 2 and the electronic board 9 being preserved for these different readers L.

In all cases, the facing 3 includes a front and bulged main wall 30 which faces the main wall 20 of the pedestal 2 in situation.

FIGS. 1 to 8 and 13 illustrate a first reader L integrating a first facing 3 which has a main wall 30 which is full, advantageously provided with a pattern MR for locating the reading area of the radio-identification badges. The pattern MR is for example composed of four non-contiguous lines defining a cross. Thus, this first reader L is only designed for a radio-identification control by means of the radio-identification reader integrated to the electronic board 9.

Figure 14:
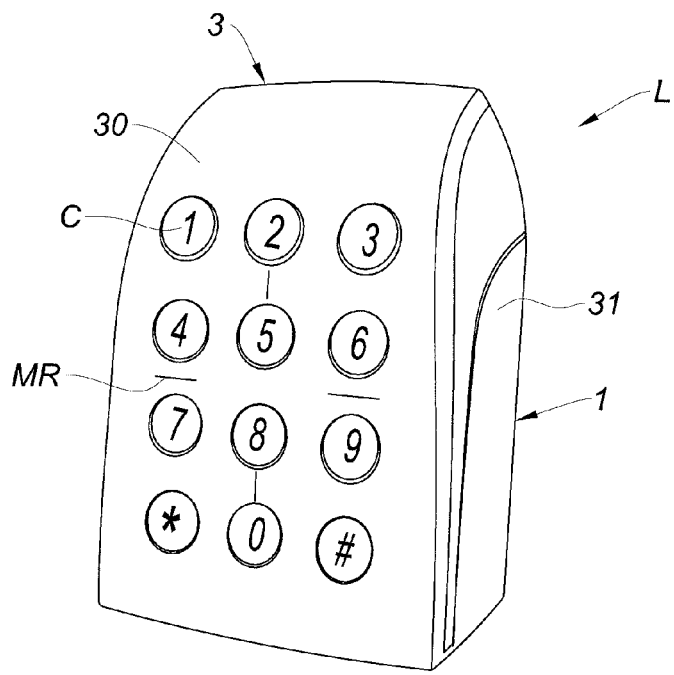
FIG. 14 is a front perspective view of a second example of a reader according to the disclosure which includes a casing provided with a front facing integrating a keyboard.
Figure 15:
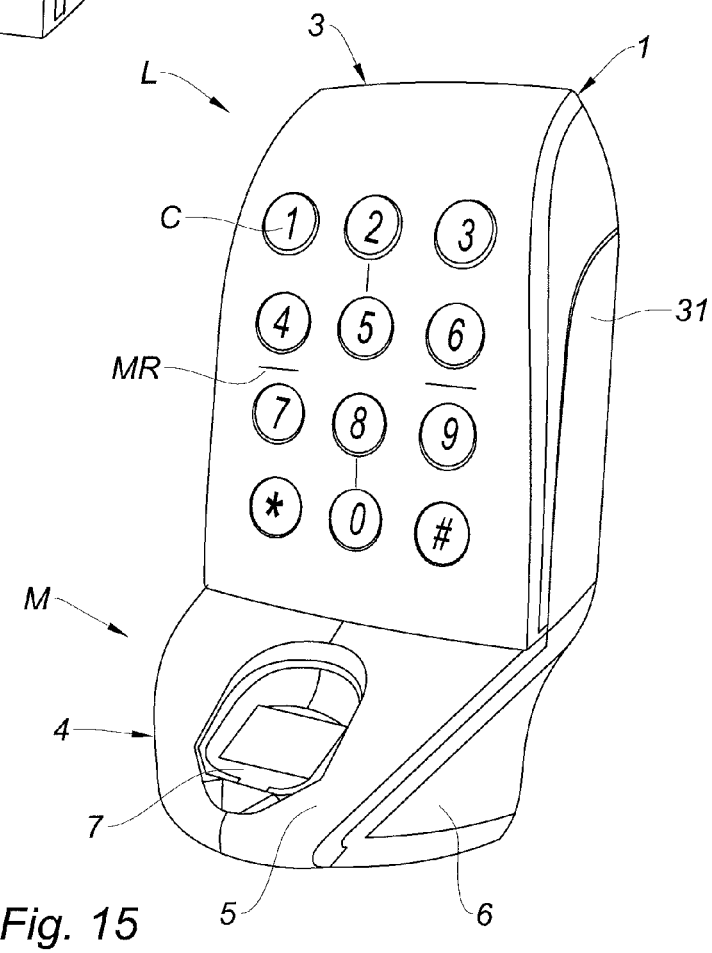
FIG. 15 is a front perspective view of a second access control system according to the disclosure composed of the assembly of the module of FIGS. 10 and 11 on the second reader of FIG. 14.

FIGS. 14 and 15 illustrate a second reader L integrating a second facing 3 which has a main wall 30 in which there is incorporated a keyboard C composed of several keys allowing inputting an identification code. Thus, this second reader L is designed for a radio-identification control (always by means of the radio-identification reader integrated to the electronic board 9) and also for a control by keyboard. The pattern MR is advantageously present on this main wall 30, for example between the keys of the keyboard C.

Figure 16:
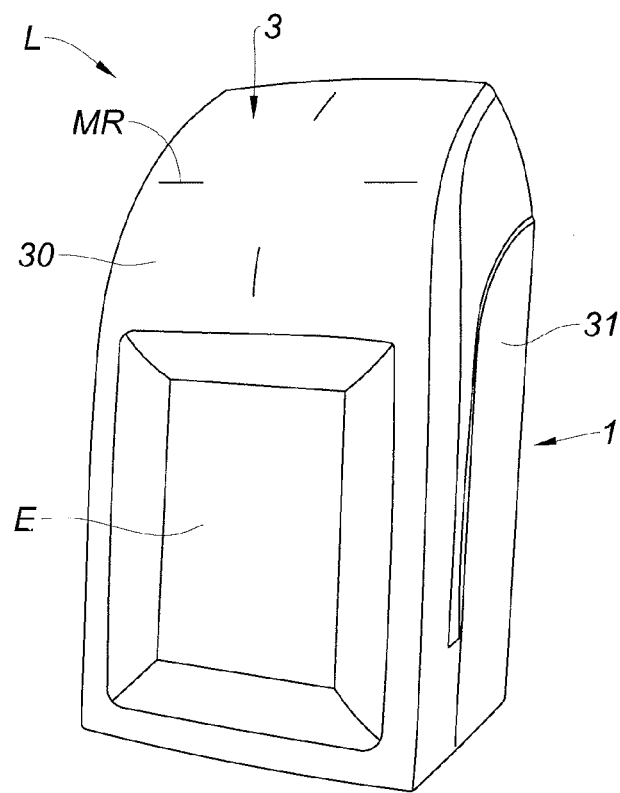
FIG. 16 is a front perspective view of a third example of reader according to the disclosure which includes a casing provided with a front facing integrating a screen.
Figure 17:
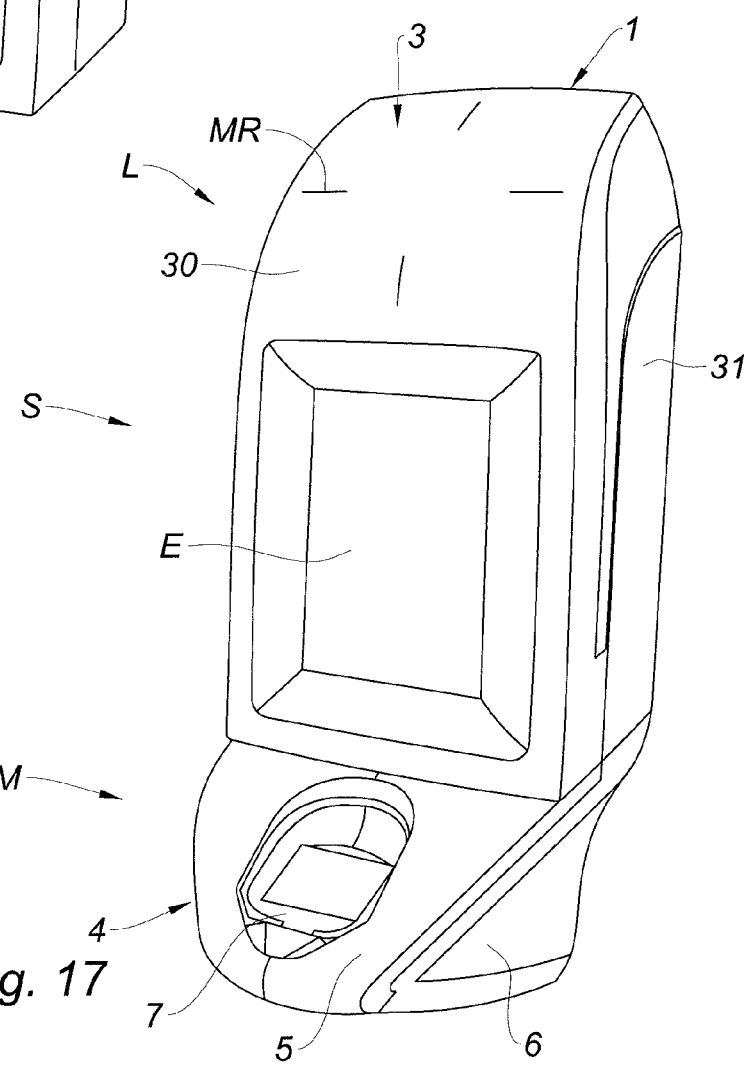
FIG. 17 is a front perspective view of a third access control system according to the disclosure composed of the assembly of the module of FIGS. 10 and 11 on the third reader of FIG. 16.

FIGS. 16 and 17 illustrate a third reader L integrating a third facing 3 which has a main wall 30 in which there is incorporated a screen E for a screen control; this screen E being preferably a touch screen for allowing, in particular, the input of an identification code. Thus, this third reader L is designed for a radio-identification control (always by means of the radio-identification reader integrated to the electronic board 9) and also for a screen control. The pattern MR is advantageously present on this main wall 30, for example above the screen E.

The three described facings 3 are interchangeable, thus ensuring a modularity to the reader L. In order to simplify this modularity, the memory of the electronic board 9 is loaded with a driving algorithm in order to drive the keyboard C and with a driving algorithm in order to drive the screen E, so that the controller of the electronic board 9 can drive the keyboard C and the screen E once the concerned new facing 3 is in place on the pedestal 2 and once the keyboard C or the screen E is connected to the electronic board 9.

In order to enable this interchangeability of the facings 3, the latter are all shaped to mechanically cooperate with the same pedestal 2 which remains in place on the support.

For each facing 3, the main wall 30 is extended, on the one hand, on the sides by lateral edges 31 which cover the lateral edges 24 of the pedestal 2 in situation and, on the other hand, on the bottom by a lower edge 32 which is in alignment with the lower edge 25 of the pedestal 2 in situation, with an given spacing EC between the two lower edges 25, 32 to form a lower slot under the casing 1.

Each facing 3 has two holes 33 arranged in the lower portion and provided to be in alignment with the two holes of the pedestal 2 for the passage of the fastening screws from the facing 3 on the pedestal 2.

Each facing 3 further includes a lower plate 34 protruding from the front wall 30 (inward of the casing 1) and disposed above the lower edge 32. As seen in FIG. 7, in the closed configuration of the casing 1, the lower edge 25 of the pedestal is tilted downward relative to the main wall 20 at a non-right angle, the lower plate 34 is orthogonal to the main wall 20 of the pedestal 2 and bears against the lower edge 25 of the pedestal 2 to limit the access and provide a tightness to the casing.

A notch 35 is arranged in the lower plate 34 and, in the closed configuration of the casing 1, this notch 35 is positioned opposite to the fuse notch 26 provided on the lower edge 25 of the pedestal 2.

Furthermore, each facing 3 includes fastening means of the electronic board 9; this electronic board 9 being thus fixed on the facing 3. During a change of facing 3, in order to facilitate the removal of the electronic board 9 of a facing 3 and to facilitate the fastening of the electronic board 9 on the new facing 3, these fastening means are composed of snap-fit means adapted for a snap-fit fastening of the electronic board 9.

These snap-fit means include a plurality of snap-fit members which protrude from the inner face of the main wall 30, including: bearing stops 36 on which the electronic board 9 bears;

Elastically deformable legs 37 equipped respectively with snap-fit teeth, designed to move away during the introduction of the board 9 and to return in position to block the board 9, these elastically deformable legs 37 being in particular disposed on the sides of the facing 3; and Fixed retaining hooks 38, these hooks 38 being in particular disposed in the upper portion of the facing 3.

Alternatively, the snap-fit means may comprise only elastically deformable legs equipped respectively with snap-fit teeth, with or without the bearing stops.

Figure 4:
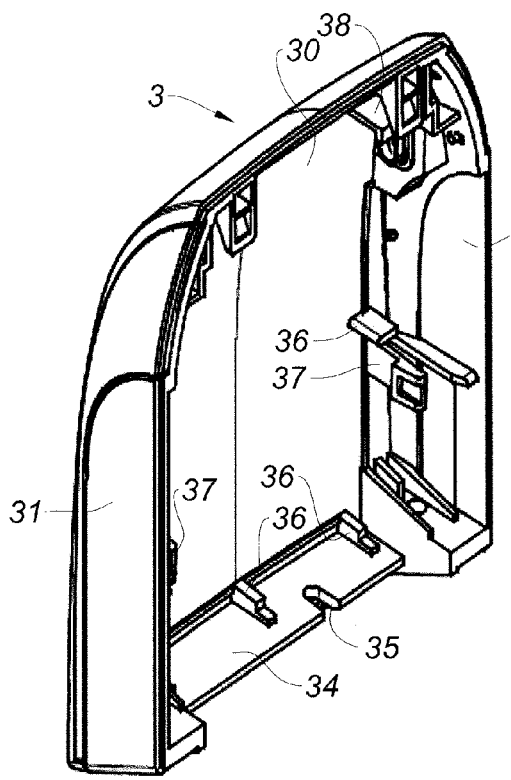
FIGS. 4 to 6 are perspective views of the back of the facing of FIG. 2, without the electronic board of the reader (FIG. 4), during the mounting of the electronic board on the facing (FIG. 5), and with the electronic board mounted on the facing (FIG. 6)
Figure 5:
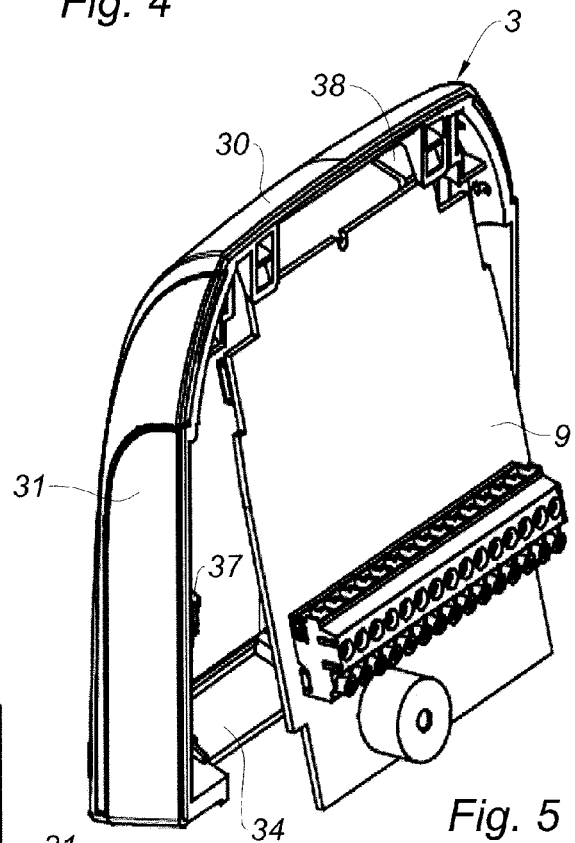
Figure 6:
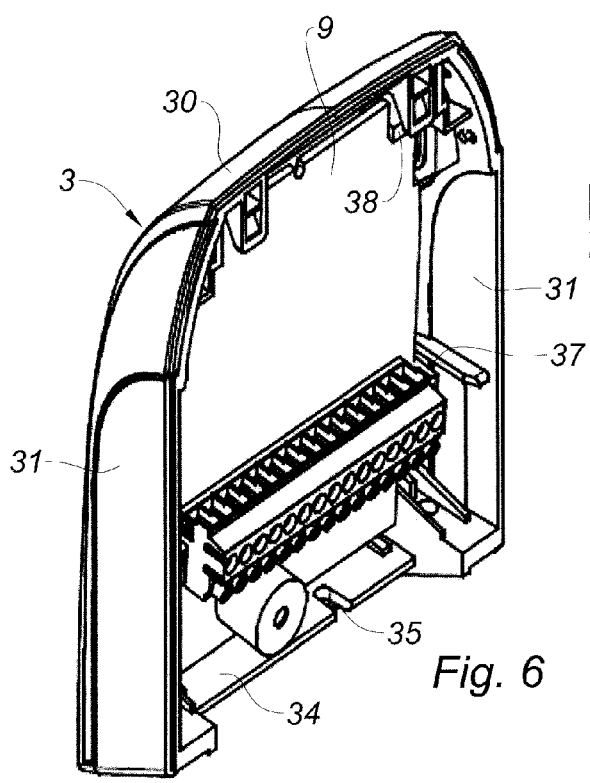

With reference to FIGS. 4 to 6, in order to fasten the board 9 on the facing 3, we only have to place, without special tooling, the top of the board 9 under the hooks 38, then to lower the bottom of the board 9 until blocking the latter under the teeth of the elastically deformable legs 37 by deformation thereof, while bearing the board 9 against the bearing stops 36.

The modularity of the disclosure is not limited to the possible changes of facings 3, but also results in the possibility to add a complementary access control module M which may be inserted onto the reader L.

Figure 11:
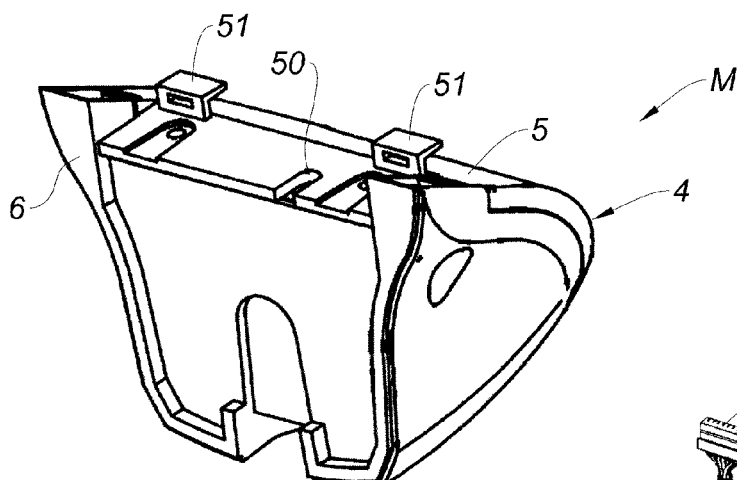
Figure 12:
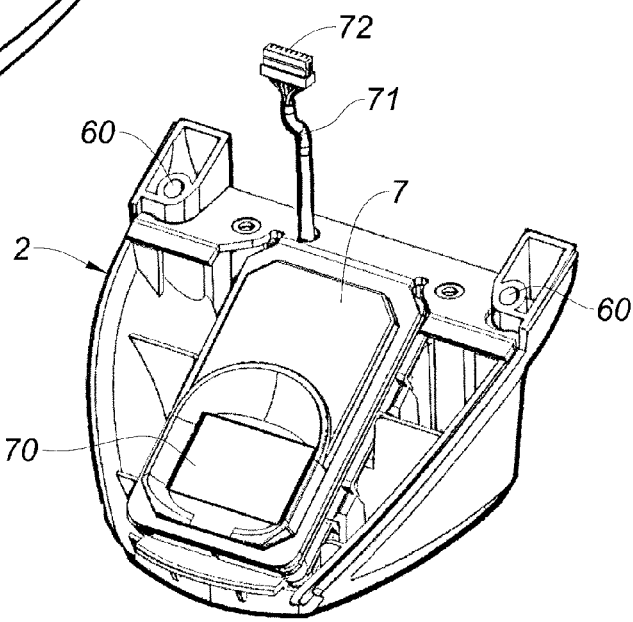
FIG. 12 is a front perspective view of the module of FIGS. 10 and 11, without its closing lid and with its connection cable.
Figure 13:
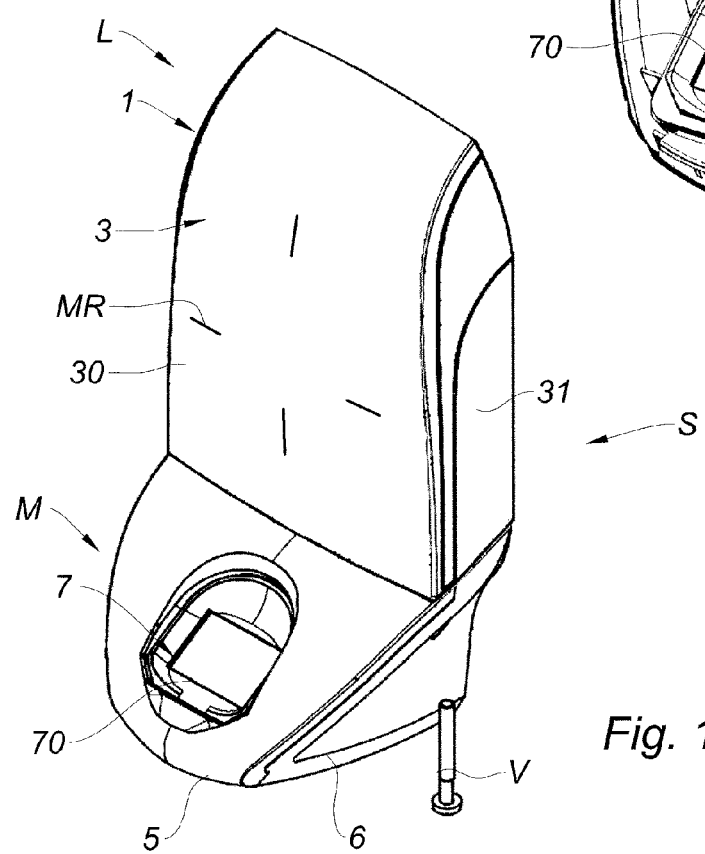
FIG. 13 is a front perspective view of a first access control system according to the disclosure composed of the assembly of the module of FIGS. 10 and 11 on the first reader of FIG. 1.

Referring to FIGS. 10 to 12, the module M includes a casing 4 composed of a cover 5 mounted on a base 6, and an complementary access control device 7 disposed within the casing 4. Once the cover 5 is mounted on the base 6, the casing 4 internally delimits a closed space within which the complementary access control device 5 is disposed.

The complementary access control device 7 is of the biometric control type and has a biometric reading surface 70, in particular for the identification of a fingerprint. However, it is understood that any other type of biometric control may be considered, such as a control by iris recognition, face recognition, palm print recognition, etc. It is also conceivable that the complementary access control device 7 is of a type other than a biometric one, such as for example the keyboard control or screen control type.

In all cases, the complementary access control device 7 has a reading interface on the cover 5 of the casing 4, such as for example the aforementioned biometric reading surface 70, a keyboard or a screen.

The complementary access control device 7 also includes a connection cable 71 outgoing from the casing 4 through an opening 50 arranged on the top of the cover 5.

This connection cable 71 is provided to pass through the fuse notch 26 (after breaking the line of weakness) and through the notch 35 to connect on the electronic board 9. For this purpose, the connection cable 71 has a free end provided with a complementary connector 72 shaped to be plugged onto a suitable connector (not illustrated) integrated into the board 9 and linked to the controller.

In order to allow taking over this module M by the controller of the board 9, and more specifically to allow driving the complementary access control device 7, the memory of the electronic board 9 is loaded with a driving algorithm to drive this complementary access control device 7, so that the controller of the electronic board 9 can drive this complementary access control device 7 once the module M is fastened to the reader L and once the complementary access control device 7 is connected to the electronic board 9 via the connection cable 71.

The casing 4 of the module M is shaped to be fastened on the casing 1 of the reader L, and more precisely under the casing 1 of the reader L.

For this fastening on the casing 4 of the module M on the outside of the casing 1 of the reader L, the casing 4 has holes 60 provided on the base 6, these holes 60 being provided to be in alignment with the holes 33 of the pedestal 2 and the facing 3 of the casing 1, in order to allow the passage of the fastening screw V (visible in FIG. 13) which ensure the fastening of the module M on the casing 1 of the reader L. Thus, the holes provided on the pedestal 2 and on the facing 3 of the casing 1, which initially serve for the fastening of the facing 3 on the pedestal 2, are used to allow the combined fastening of the facing 3 on the pedestal 2 and of the module M on the casing 1.

Before operating the screw fastening of the module M on the casing 1, it is interesting to ensure a temporary holding and an indexing of the module M on the casing 1. To do so, the casing 4 has legs 51 provided on the cover 5, which protrude on the top of the casing 4.

These temporary holding legs 51 are hook-shaped and adapted to be engaged through the lower spacing slot EC provided under the casing 1 between the two lower edges 25, 32, and to bear on the lower edge 32 of the facing 3.

The mounting of the module M on the reader L is performed as follows:

removing the fastening screws from the facing 3 on the pedestal 2;

removing the facing 3;

ensuring the centering and the provisional holding of the module M on the facing 3, by placing the legs 51 bearing against the lower edge 32 of the facing 3 and, while taking care to pass the connection cable 71 through the notch 35, connecting the connection cable 71 to the board 9;

breaking the line of weakness delimiting the fuse notch 26 of the pedestal 2;

remounting the facing 3 on the pedestal 2, the module M being temporarily held on the facing 3, while taking care to pass the connection cable 71 through the fuse notch 26;

screwing fastening screws V (preferably of the tamper-proof screw type) of the facing 3 on the pedestal 2 and of the module M on the casing 1.

Once the module M mounted on and connected to the reader L, the module M and the reader L together form a access control system S which has the control features of the reader L and the control features of the module M, with automatically taking over the automatic management of all these features by the controller of the electronic board 9.

It is also conceivable to predict, before the remounting step of the facing, a step of fastening a rigid rear (for example metallic) plate on the pedestal 2 and/or on the support, this plate being in the continuity of the main wall 20 of the pedestal 2 in order to reinforce the overall stiffness of the access control system S.

The invention claimed is:

1. An access control reader comprising:
   a casing provided with a pedestal having a main wall provided for a fastening on a support and at least a facing mounted on said pedestal, the facing comprising a front wall facing the main wall of the pedestal in a closed configuration of the casing; and
   an electronic board integrating at least a controller, a memory and a main access control device, said controller driving said main access control device by the implementation of a first driving algorithm loaded in the memory;
   wherein the casing includes fastening means for the fastening of a complementary access control module and passage means for the passage of a connection cable between said complementary access control module and a connector mounted on said electronic board, and the memory of the electronic board is loaded with a second driving algorithm to drive said complementary access control module so that the controller drives said complementary access control module once said connection cable is plugged onto said connector,
   wherein the fastening means include:
      fastening holes provided on the pedestal and on the facing for the passage of fastening screws; and
      temporary holding and indexing means for holding and indexing said complementary access control module on the casing,
   and wherein a temporary holding and indexing means comprise:
      a lower edge of the pedestal protruding from the main wall; and
      a lower edge of the facing protruding from the front wall where, in the closed configuration of the casing, the lower edge of the facing is in alignment with the lower edge of the pedestal with a given spacing between the two lower edges to form a lower slot under the casing, in order to allow the passage and the indexing of holding legs of the complementary access control module.

2. The access control reader according to claim 1, wherein the passage means comprise a line of weakness arranged on the lower edge of the pedestal to form an incipient crack of a fuse notch.

3. The access control reader according to claim 2, wherein the facing further includes a lower plate protruding from the front wall and disposed above the lower edge where, in the closed configuration of the casing, said plate bears against the lower edge of the pedestal, and the passage means also comprise a notch arranged in said plate and which is, in the closed configuration of the casing, positioned opposite the fuse notch provided on the lower edge of the pedestal.

4. The access control reader according to claim 3, wherein the lower edge of the pedestal is tilted downward relative to the main wall at a non-right angle and, in the closed configuration of the casing, the plate of the facing is orthogonal to the main wall of the pedestal.

5. The access control reader according to claim 1, wherein the casing of the access control reader comprises at least another facing interchangeable with the facing of the casing, said another facing being equipped with a secondary access control device, and where the memory of the electronic board is loaded with a third driving algorithm to drive said secondary access control device so that the controller drives said secondary access control device, once the other facing has replaced the facing on the casing and the secondary access control device is connected to the electronic board.

6. The access control reader according to claim 1, wherein the facing includes snap-fit means adapted for a snap-fit fastening of the electronic board.

7. The access control reader according to claim 6, wherein the snap-fit means comprise bearing stops for the electronic board and elastically deformable legs equipped respectively with snap-fit teeth.

8. The access control reader according to claim 7, wherein the snap-fit teeth are provided with fixed retaining hooks.

9. An access control system comprising an access control reader according to claim 1 and a complementary access control module, wherein said complementary access control module comprising:
   a casing equipped with complementary fastening means shaped to cooperate with the fastening means of the casing of the access control reader; and
   a complementary access control device, disposed in said casing of the complementary access control module and connected to a connection cable outgoing from said casing of the complementary access control module and shaped to pass through the passage means provided on the casing of the access control reader, said connection cable having a free end provided with a complementary connector shaped to be plugged onto the connector of the electronic board of the access control reader;
   wherein the complementary fastening means comprise:
      holes arranged on the complementary access control module and adapted to match with the fastening holes of the access control reader, in order to allow the mating fastening of the complementary access control module on the casing of the access control reader and of the facing of the complementary access control module on the pedestal of the complementary access control module with the same fastening screws; and
      complementary temporary holding and indexing means shaped to cooperate with a temporary holding and indexing means of the access control reader;
   wherein the complementary temporary holding and indexing means include holding legs adapted to be engaged through the lower slot provided under the casing of the access control reader and to bear on the lower edge of the facing of the access control reader;
   and wherein the casing of the complementary access control module is fastened on the casing of the access control reader and the complementary access control device is connected to the electronic board of the access control reader by means of the connection cable passing through the passage means provided on the casing of the access control reader (L).

10. The access control system according to claim 9, wherein the complementary access control device is a biometric control device or a keyboard control device.

11. The access control reader according to claim 1, wherein said main access control device is a radio-identification RFID reader.

12. A complementary access control module, adapted to be fastened and connected to an access control reader said complementary access control module comprising:
   a casing equipped with complementary fastening means shaped to cooperate with fastening means of a casing of the access control reader; and
   a complementary access control device, disposed in said casing of the complementary access control module and connected to a connection cable outgoing from said casing of the complementary access control module and shaped to pass through passage means provided on the casing of the access control reader, said connection cable having a free end provided with a complementary connector shaped to be plugged onto a connector of an electronic board of the access control reader;

wherein the complementary fastening means comprise:
  holes arranged on the complementary access control module and adapted to match with fastening holes of the access control reader, in order to allow the mating fastening of the complementary access control module on the casing of the access control reader and of the facing of the complementary access control module on a pedestal of the complementary access control module with same fastening screws; and
  complementary temporary holding and indexing means shaped to cooperate with a temporary holding and indexing means of the access control reader; and wherein the complementary temporary holding and indexing means include holding legs adapted to be engaged through a lower slot provided under the casing of the access control reader and to bear on a lower edge of the facing of the access control reader.

13. The complementary access control module according to claim 12, wherein the complementary access control device is a biometric control device or a keyboard control device.

\* \* \* \* \*